United States Patent
Tanaka

(10) Patent No.: US 11,508,672 B2
(45) Date of Patent: Nov. 22, 2022

(54) SEMICONDUCTOR DEVICE

(71) Applicant: SUMITOMO ELECTRIC DEVICE INNOVATIONS, INC., Kanagawa (JP)

(72) Inventor: Tuneyuki Tanaka, Yokohama (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 0 days.

(21) Appl. No.: 17/127,685

(22) Filed: Dec. 18, 2020

(65) Prior Publication Data

US 2021/0134739 A1    May 6, 2021

Related U.S. Application Data

(63) Continuation of application No. 16/506,075, filed on Jul. 9, 2019, now Pat. No. 10,903,171.

(30) Foreign Application Priority Data

Jul. 10, 2018 (JP) .............................. JP2018-130920

(51) Int. Cl.
*H01L 23/00* (2006.01)
*H01L 23/498* (2006.01)

(52) U.S. Cl.
CPC ...... *H01L 23/562* (2013.01); *H01L 23/49838* (2013.01); *H01L 23/49894* (2013.01)

(58) Field of Classification Search
CPC ............. H01L 51/5246; H01L 27/3246; H01L 51/5253; H01L 27/156; H01L 27/1214; H01L 23/481; H01L 33/12; H01L 33/22; H01L 33/36; H01L 33/56
See application file for complete search history.

(56) References Cited

U.S. PATENT DOCUMENTS

2014/0306334 A1   10/2014   Takagi
2017/0236769 A1*  8/2017   Dutta ................... H01L 23/10
                                                                    165/81

FOREIGN PATENT DOCUMENTS

| JP | S59-161845 | 9/1984 |
|----|------------|--------|
| JP | S63-187651 | 8/1988 |
| JP | H9-307020  | 11/1997 |
| JP | 2004-055985 | 2/2004 |
| JP | 2014-207388 | 10/2014 |

* cited by examiner

*Primary Examiner* — Elias Ullah
(74) *Attorney, Agent, or Firm* — Smith, Gambrell & Russell, LLP.

(57) ABSTRACT

A semiconductor device including a base, a buffer member, a frame, a lid, and a semiconductor element, is disclosed. The ceramic frame is mounted on the copper base with the molybdenum buffer member interposed therebetween. The semiconductor element is sealed in a space within the frame defined by the lid. The frame includes a top portion, a lower stage portion that is disposed below the top portion and is provided with an input electrode and an output electrode, and an upper stage portion. The upper stage portion is formed in an arrangement direction of the input electrode and the output electrode, and is formed below the top portion and above the lower stage portion. The upper stage portion includes an upper stage connection portion formed on the periphery of the lower stage portion in a direction intersecting the arrangement direction of the input electrode and the output electrode.

9 Claims, 4 Drawing Sheets

SEMICONDUCTOR DEVICE

CROSS REFERENCE TO RELATED APPLICATIONS

The present application is a continuation application that is based upon and claims the benefit of priority from U.S. application Ser. No. 16/506,075 filed on Jul. 9, 2019, and from Japanese patent application No. 2018-130920 filed on Jul. 10, 2018, the entire contents of which are incorporated herein by reference.

TECHNICAL FIELD

The present disclosure relates to a semiconductor device.

BACKGROUND

A semiconductor device is installed in, for example, a communication device. The semiconductor device includes a coper base and a ceramic frame mounted on the base, and a semiconductor element thereof is sealed in a space formed by the frame. Since the copper base and the ceramic frame have different linear expansion coefficients, a crack can be generated in the frame due to a difference in linear expansion coefficient. JP S59-161845 discloses a structure that prevents a crack from being generated in the frame by interposing a buffer member (molybdenum plate) formed of molybdenum between the base (package base) and the frame (enclosure).

SUMMARY

The present disclosure provides a semiconductor device. The semiconductor device comprises a base, a buffer member, a frame, a lid, and a semiconductor element. The base is formed of copper. The buffer member is formed of molybdenum. The frame is mounted on the base with the buffer member interposed therebetween and the frame is formed of alumina ceramic. The lid covers the frame. The semiconductor element is sealed in a space within the frame defined by the lid. The frame includes a top portion, a lower stage portion, and an upper stage portion. The top portion includes a seal ring to which the lid is fixed. The lower stage portion is disposed below the top portion and is provided with an input electrode inputting a signal to the semiconductor element and an output electrode outputting a signal from the semiconductor element. The upper stage portion is formed in an arrangement direction of the input electrode and the output electrode, and is formed at a position below the top portion and above the lower stage portion. The upper stage portion includes an upper stage connection portion formed on the periphery of the lower stage portion in a direction intersecting the arrangement direction of the input electrode and the output electrode.

The present disclosure also provides a semiconductor device. The semiconductor device comprises a base, a buffer member, a frame, a lid, and a semiconductor element. The base is formed of copper. The buffer member is formed of molybdenum. The frame is mounted on the base with the buffer member interposed therebetween, and is formed of alumina ceramic. The lid covers the frame. The semiconductor element is sealed in a space within the frame defined by the lid. The frame includes a top portion, a lower stage portion, and an upper stage portion. The top portion includes a seal ring to which the lid is fixed. The lower stage portion is disposed below the top portion. The lower stage portion is provided with an input electrode inputting a signal to the semiconductor element and an output electrode outputting a signal from the semiconductor element. The lower stage portion includes a reinforcing metal pattern that is provided at a position without the input electrode and the output electrode on the same plane as that of the output electrode so as to be insulated from the input electrode and the output electrode. The upper stage portion is formed in an arrangement direction of the input electrode and the output electrode, and is formed at a position below the top portion and above the lower stage portion.

BRIEF DESCRIPTION OF THE DRAWINGS

The foregoing and other purposes, aspects and advantages will be better understood from the following detailed description of embodiments of the disclosure with reference to the drawings, in which.

DETAILED DESCRIPTION

Figure 1A:
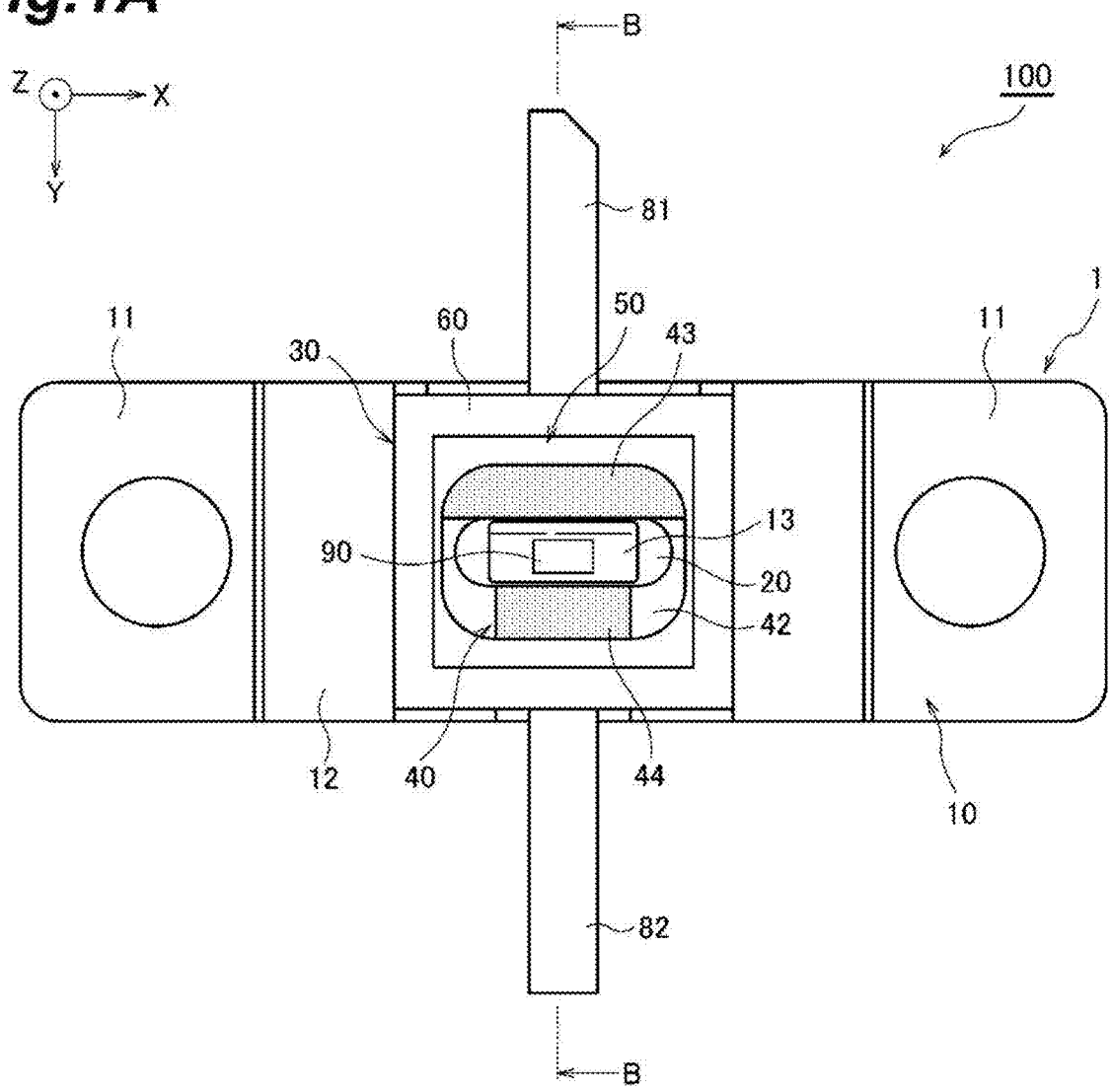
FIGS. 1A and 1B are diagrams for illustrating a semiconductor device according to one embodiment of the present disclosure.

Problem to be Solved by the Present Disclosure

The frame described in JP S59-161845 includes a top portion (an upper portion of the frame) of which an upper side is covered by a lid and to which the lid is fixed, and a lower stage portion (a lower portion of the frame) which is disposed on the lower in relation to the top portion. A step is formed therebetween in the frame, and an electrode pad which is wire-bonded to the semiconductor element is provided on an upper surface of the step. Since distortion is concentrated at a boundary between the top portion and the lower stage portion due to a difference in thickness between the top portion and the lower stage portion, a crack can be generated in the lower stage portion.

Effect of the Present Disclosure

According to the present disclosure, it is possible to prevent a crack from being generated in a lower stage portion of the frame.

Description of Embodiments of the Present Disclosure

Embodiments of the present disclosure will be described. A semiconductor device according to one embodiment of the disclosure comprises a base, a buffer member, a frame, a lid, and a semiconductor element. The base is formed of copper. The buffer member is formed of molybdenum. The frame is mounted on the base with the buffer member interposed therebetween and the frame is formed of alumina ceramic. The lid covers the frame. The semiconductor element is sealed in a space within the frame defined by the lid. The frame includes a top portion, a lower stage portion, and an upper stage portion. The top portion includes a seal ring to which the lid is fixed. The lower stage portion is disposed below the top portion and is provided with an input electrode inputting a signal to the semiconductor element and an output electrode outputting a signal from the semiconductor element. The upper stage portion is formed in an arrangement direction of the input electrode and the output electrode, and is formed at a position below the top portion and above the lower stage portion. The upper stage portion includes an upper stage connection portion formed on the periphery of the lower stage portion in a direction intersecting the arrangement direction of the input electrode and the output electrode.

A semiconductor device according to another embodiment of the disclosure comprises a base, a buffer member, a frame, a lid, and a semiconductor element. The base is formed of copper. The buffer member is formed of molybdenum. The frame is mounted on the base with the buffer member interposed therebetween, and is formed of alumina ceramic. The lid covers the frame. The semiconductor element is sealed in a space within the frame defined by the lid. The frame includes a top portion, a lower stage portion, and an upper stage portion. The top portion includes a seal ring to which the lid is fixed. The lower stage portion is disposed below the top portion. The lower stage portion is provided with an input electrode inputting a signal to the semiconductor element and an output electrode outputting a signal from the semiconductor element. The lower stage portion includes a reinforcing metal pattern that is provided at a position without the input electrode and the output electrode on the same plane as that of the output electrode so as to be insulated from the input electrode and the output electrode. The upper stage portion is formed in an arrangement direction of the input electrode and the output electrode, and is formed at a position below the top portion and above the lower stage portion.

In the above another embodiment, the lower stage portion may include a frame opening surrounding a periphery of the semiconductor element. The frame opening may be provided with the reinforcing metal pattern, and the reinforcing metal pattern may be a GND wiring that is electrically connected to the base through the buffer member.

Details of the Embodiments of the Present Disclosure

Figure 1B:
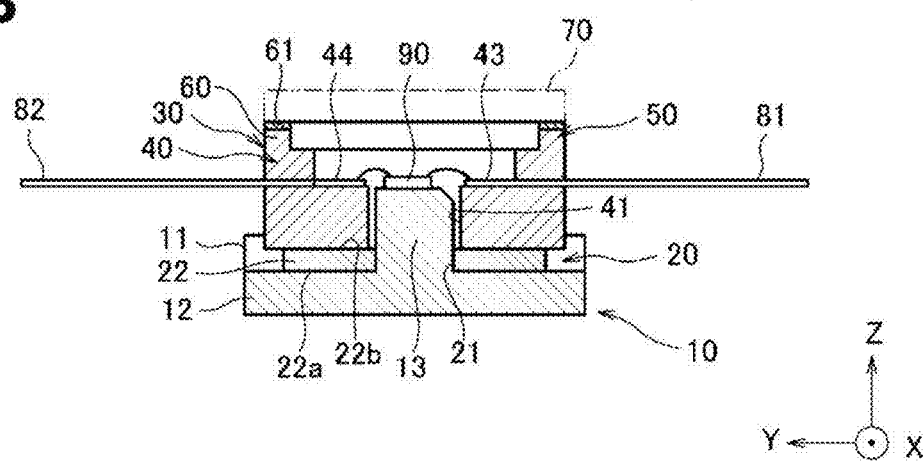

Hereinafter, a detailed example of a semiconductor device according to the present disclosure will be described with reference to the accompanying drawings. FIGS. 1A and 1B are diagrams for illustrating a semiconductor device according to an embodiment of the present disclosure.

The semiconductor device 100 includes a base 1, a buffer member 20, a frame 30, a lid 70 and a semiconductor element 90. The semiconductor device 100 can be mounted on a front end of a communication device, for example. FIG. 1A schematically illustrates a semiconductor element 90 mounted within the frame 30 by separating the lid 70.

As illustrated in FIG. 1A, the base 1 includes a base body 10 formed of copper. Both ends of the base body 10 are respectively provided with a screw fixing portion 11 through which a fixing screw (not illustrated) is inserted. A heat sink 12 which is thinner than the screw fixing portion 11 is provided between the screw fixing portions 11. As illustrated in FIG. 1B, a center portion of the heat sink 12 is provided with a mounting table 13 which protrudes upward (the Z direction in the drawing) and the semiconductor element 90 is mounted on the mounting table 13.

The buffer member 20 is formed of molybdenum and compensates a difference in linear expansion coefficient between the base body 10 formed of copper and the frame 30 formed of alumina ceramic. The buffer member 20 includes, as illustrated in FIG. 1B, a plate-shaped buffer portion 22 and a center of the buffer portion 22 is provided with a buffer opening 21 which penetrates a front surface 22b and a rear surface 22a. The mounting table 13 penetrates the buffer opening 21, the rear surface 22a of the buffer portion 22 is in contact with the base body 10, and the front surface 22b of the buffer portion 22 is in contact with the frame 30.

The frame 30 is surrounded by four side walls extending in the X and Y directions illustrated in the drawings and is formed in a square shape in appearance when viewed from the front side. As illustrated in FIG. 1B, the frame 30 includes a lower stage portion 40, an upper stage portion 50, and a top portion 60. The lower stage portion 40 is mounted on the buffer member 20. The upper stage portion 50 is located on the upper side in relation to the lower stage portion 40. The top portion 60 is located on the upper side in relation to the upper stage portion 50, and adheres to the lid 70.

The lid 70 is formed of gold tin, for example. The lid 70 is fixed to the top portion 60 with a seal ring 61 interposed therebetween. Accordingly, the semiconductor element 90 is air-tightly sealed in a space within the frame 30 defined by the lid 70.

Figure 2:
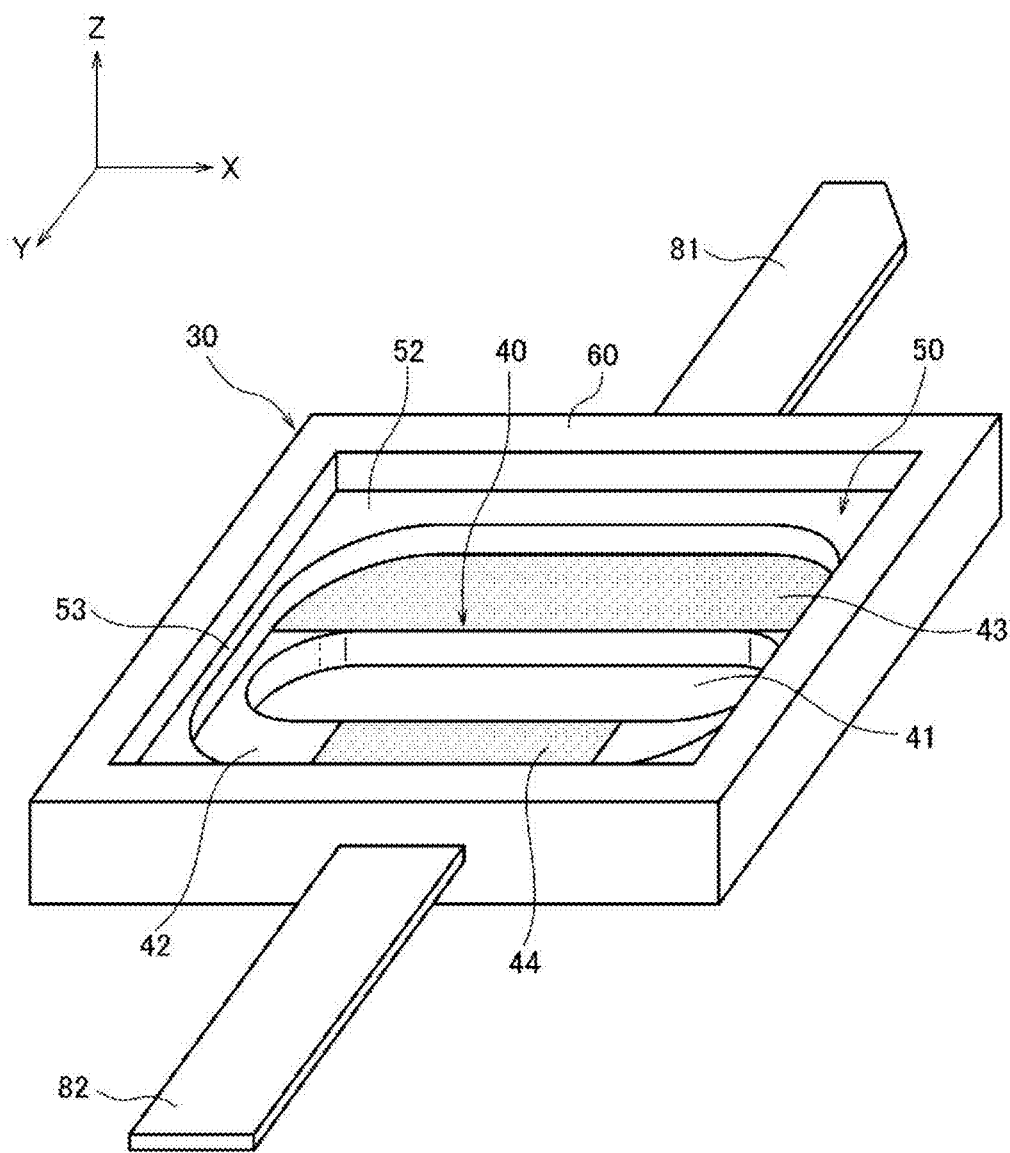
FIG. 2 is an external perspective view of a frame of a first example.
Figure 3A:
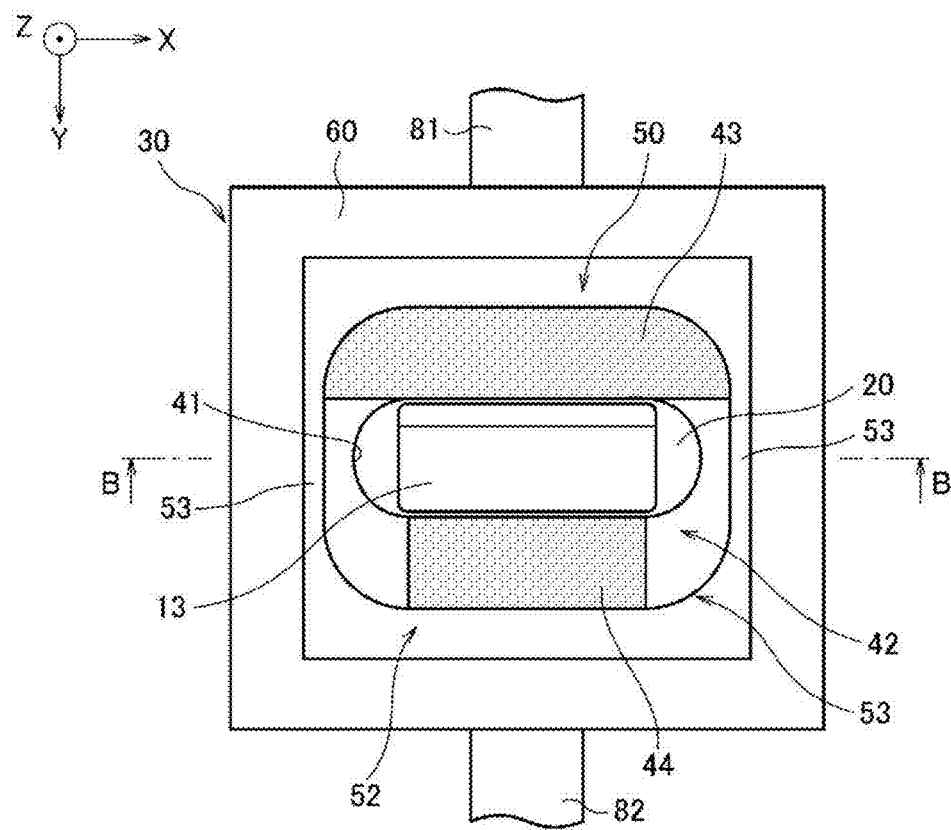
FIG. 3A is a plan view of a main part of a semiconductor device of the first example and FIG. 3B is a cross-sectional view taken along a line B-B of FIG. 3A.
Figure 3B:
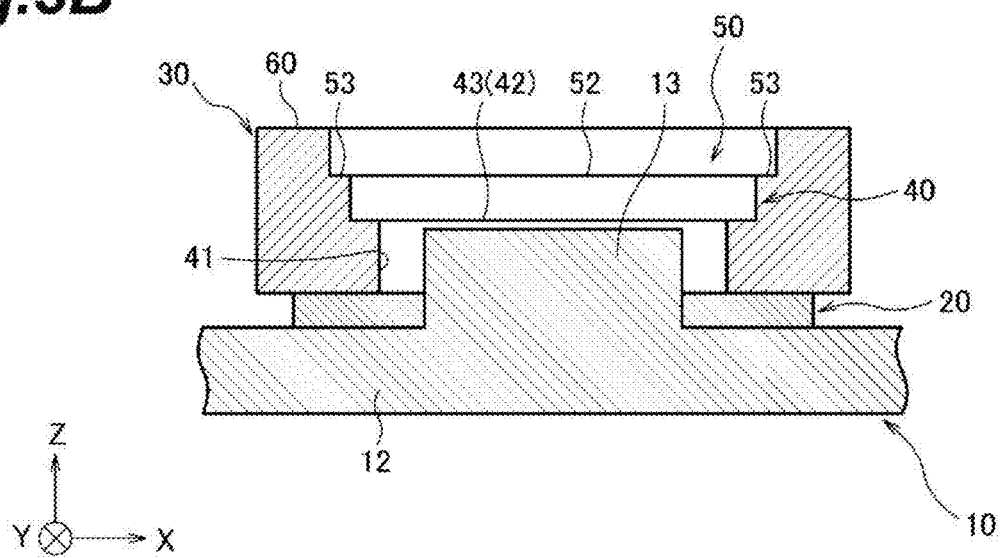

FIG. 2 is an external perspective view of the frame of the first example, FIG. 3A is a plan view of a main part of the semiconductor device of the first example, and FIG. 3B is a cross-sectional view taken along a line B-B of FIG. 3A. FIG. 3A illustrates the mounting table 13 in order to easily understand the structure of the frame 30, but the semiconductor element 90 or the base body 10 described in FIGS. 1A and 1B is omitted.

The lower stage portion 40 of the frame 30 includes a frame opening 41 and a step surface 42. The frame opening 41 is formed at the center so as to surround the mounting table 13. The step surface 42 is formed at the outside of the frame opening 41 so as to surround the frame opening 41 in the entire circumference.

The step surface 42 is provided with an input electrode 43 which is provided between an input terminal 81 and the mounting table 13 so as to input a signal to the semiconductor element 90 described in FIGS. 1A and 1B. The input electrode 43 is wire-bonded to the semiconductor element 90. An output electrode 44 is provided between an output terminal 82 and the mounting table 13 so as to output a signal from the semiconductor element 90. The output electrode 44 is wire-bonded to the semiconductor element 90. The input electrode 43 is formed so as to be wider than the output electrode 44.

In order to improve the air-tightness inside the frame 30, the upper stage portion 50 of the frame 30 is formed so as to be higher than the step surface 42. An upper stage surface 52 is provided between the top portion 60 and the input electrode 43 and between the output electrode 44 and the top portion 60.

The upper stage portion 50 includes a pair of upper stage connection portions 53 which are formed in a direction (the X direction of the drawing) intersecting the arrangement direction (the Y direction of the drawing) of the input electrode 43 and the output electrode 44. The pair of upper stage connections portions 53 solve a difference in height between the top portion 60 and the lower stage portion 40. More specifically, the upper stage connection portions 53 are formed along the inner walls of the frame 30 and on the peripheral of the lower stage portion 40 so as to be one step higher than the lower stage portion 40. The upper stage connection portions 53 are flush with, for example, the upper stage surface 52. The upper stage connection portions 53 can be easily made by changing a die for forming the upper stage portion 50.

The top portion 60 and the lower stage portion 40 are positions where a change in thickness is the largest in the frame 30. When a large difference in height exists between the top portion 60 and the lower stage portion 40, a crack extending in a direction (the X direction of the drawing) intersecting the arrangement direction (the Y direction of the drawing) of the input electrode 43 and the output electrode 44 is generated in the step surface 42 from a boundary between the top portion 60 and the lower stage portion 40 as a start position when the semiconductor device is subjected to 50 cycles of a heat cycle test at −65° C. to 175° C. This crack is a factor causing a leak failure.

However, since the upper stage connection portion 53 is formed between the top portion 60 and the lower stage portion 40 as described above, it is possible to reduce the concentration of the distortion generated at the boundary between the top portion 60 and the lower stage portion 40 due to a large difference in height between the top portion 60 and the lower stage portion 40. Thus, the semiconductor device 100 of this example can prevent from generating the crack in the step surface 42.

In the above-described first example, an example in which the upper stage connection portion 53 is provided to solve a large difference in height between the top portion 60 and the lower stage portion 40 has been described. However, the present invention is not limited to this example.

Figure 4A:
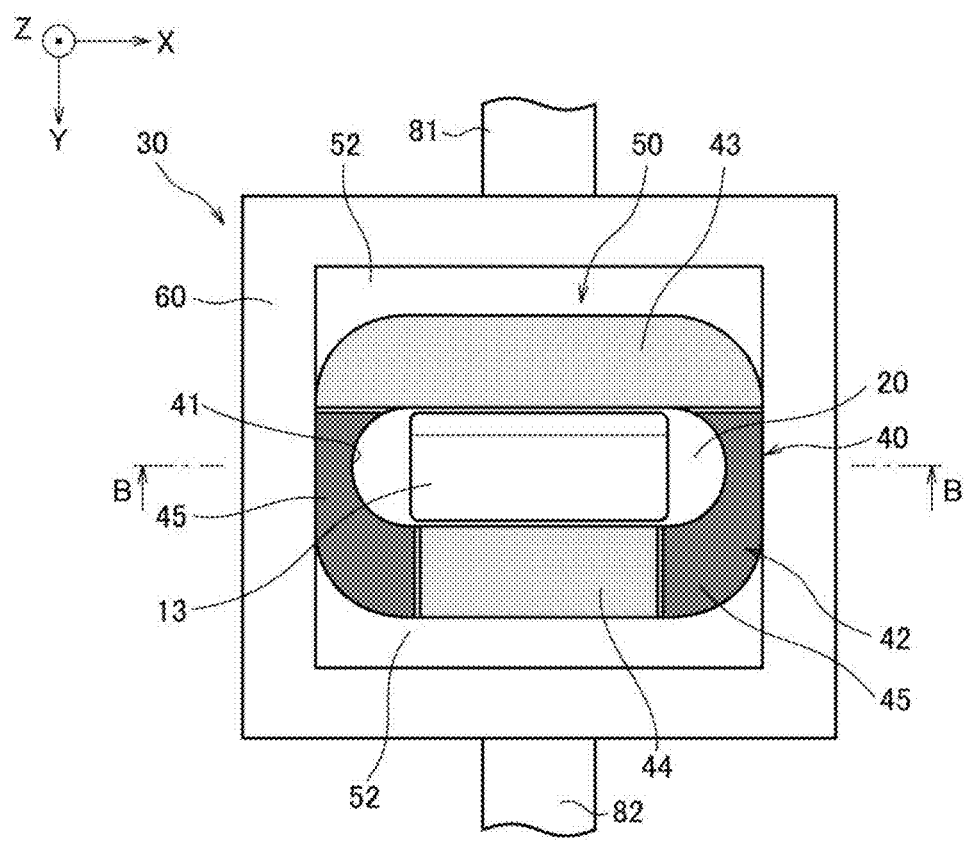
FIG. 4A is a plan view of a main part of a semiconductor device of a second example and FIG. 4B is a cross-sectional view taken along a line B-B of FIG. 4A.
Figure 4B:
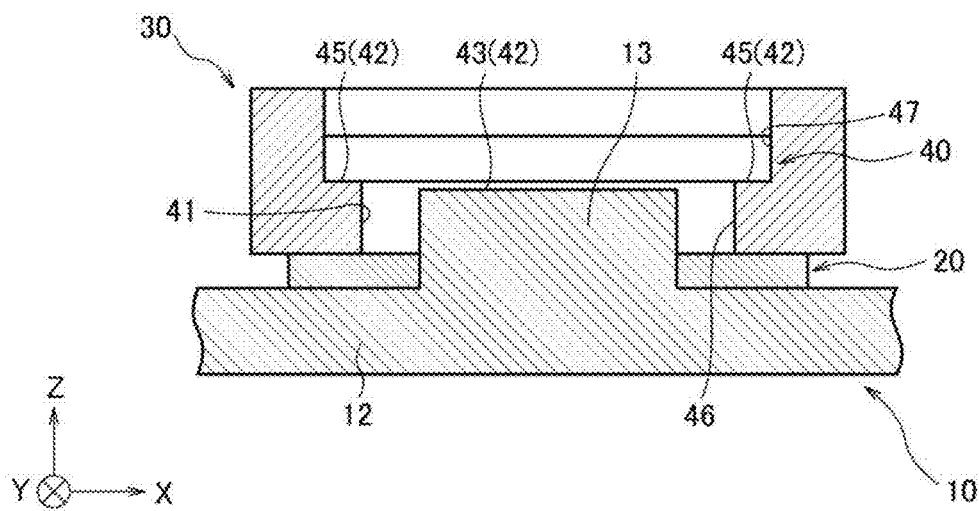

FIG. 4A is a plan view of a main part of a semiconductor device of a second example and FIG. 4B is a cross-sectional view taken along a line B-B of FIG. 4A.

As illustrated in FIGS. 4A and 4B, the upper stage portion 50 of this example includes the upper stage surface 52 which is formed between the top portion 60 and the input electrode 43 and between the output electrode 44 and the top portion 60. Meanwhile, the step surface 42 of the lower stage portion 40 reaches the inner wall of the frame 30 and a large difference in height exists between the top portion 60 and the lower stage portion 40.

However, the step surfaces 42 are provided with reinforcing metal patterns 45 which are respectively provided at a position without the input electrode 43 and the output electrode 44 on the same plane as that of the output electrode 44. Each metal pattern 45 is formed of gold plating (for example, a thickness of about 2.5 (μm)) and is insulated from the input electrode 43 and the output electrode 44. The reinforcing metal patterns 45 can be easily made by the same step as that of the output electrode 44.

Since the reinforcing metal patterns 45 are formed on the step surface 42 like this, it is possible to reduce the concentration of the distortion generated at the boundary between the top portion 60 and the lower stage portion 40 due to a large difference in height between the top portion 60 and the lower stage portion 40 in this example. Thus, the semiconductor device 100 of this example can prevents from generating the crack in the step surface 42.

In addition, as illustrated in FIG. 4B, the frame opening 41 may be provided with a reinforcing metal pattern 46. In this case, the reinforcing metal pattern 46 is set as a GND wiring which is electrically connected to the base body 10 through the buffer member 20. Accordingly, the strength of the lower stage portion 40 can be further improved.

Alternatively, a reinforcing metal pattern 47 can be provided in the inner wall of the frame 30 located on the outside in relation to the step surface 42. This example can improve the strength of the lower stage portion 40.

It should be considered that the embodiments and the examples disclosed herein are illustrative and non-restrictive in every respect. The scope of the invention is expressed by the scope of claims instead of the above-described meaning. It is intended to include all modifications within the meaning and scope equivalent to the claims.

What is claimed is:

1. A package comprising:
   a based formed of copper,
   a buffer member formed of molybdenum, and
   a frame mounted on the base with the buffer member interposed therebetween, the fame being formed of alumina ceramic,
   wherein the frame includes an input electrode inputting a signal and an output electrode outputting a signal,
   wherein the frame includes a lower stage portion, the lower stage portion including an opening portion and a step surface, and
   wherein the input electrode and the output electrode are placed on the step surface of the lower stage portion.

2. The package according to claim 1, wherein the frame includes a first reinforcing metal pattern placed on the step surface of the lower stage portion.

3. The package according to claim 2, wherein the frame includes a second reinforcing metal pattern, and the first and second reinforcing metal patterns are provided at both ends of the output electrode, respectively.

4. The package according to claim 2, wherein the first reinforcing metal pattern is a ground wiring that is electrically connected to the base through the buffer member.

5. A package comprising:
   a based formed of copper,
   a buffer member formed of molybdenum, and
   a frame mounted on the base with the buffer member interposed therebetween, the fame being formed of alumina ceramic,
   wherein the frame includes an input electrode inputting a signal and an output electrode outputting a signal, and
   wherein the frame further includes:
      a lower stage portion having an opening portion; and
      an upper stage portion having an opening portion larger than the opening portion of the lower stage portion.

6. The package according to claim 5, wherein the base includes a mounting table penetrating both the opening portion of the lower stage portion and the opening portion of the upper stage portion.

7. A package comprising:
   a base formed of copper;
   a buffer member formed of molybdenum;
   a frame mounted on the base with the buffer member interposed therebetween, the frame being formed of alumina ceramic, and including an input electrode inputting a signal and an output electrode outputting a signal; and
   a lid covering the frame, the lid defining a space within the frame.

8. The package according to claim 7, wherein the lid is formed of an alloy of gold and tin.

9. A package comprising:
   a base formed of copper;
   a buffer member formed of molybdenum;

a frame mounted on the base with the buffer member interposed therebetween, the frame being formed of alumina ceramic, wherein the frame includes an input electrode inputting a signal and an output electrode outputting a signal; and wherein the buffer member has an opening provided in a center thereof, and the base includes a mounting table penetrating in the opening of the buffer member.

\* \* \* \* \*